(12) United States Patent
Zhang

(10) Patent No.: US 12,067,923 B2
(45) Date of Patent: Aug. 20, 2024

(54) AMBIENT ILLUMINATION INTENSITY DETERMINING METHOD AND APPARATUS, AND STORAGE MEDIUM

(71) Applicant: Honor Device Co., Ltd., Shenzhen (CN)

(72) Inventor: Zhengqi Zhang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/548,132

(22) PCT Filed: May 20, 2022

(86) PCT No.: PCT/CN2022/094275
§ 371 (c)(1),
(2) Date: Aug. 28, 2023

(87) PCT Pub. No.: WO2023/000804
PCT Pub. Date: Jan. 26, 2023

(65) Prior Publication Data
US 2024/0135853 A1    Apr. 25, 2024
US 2024/0233597 A9    Jul. 11, 2024

(30) Foreign Application Priority Data

Jul. 19, 2021   (CN) .......................... 202110815390.8

(51) Int. Cl.
G09G 3/20    (2006.01)
(52) U.S. Cl.
CPC ... G09G 3/2003 (2013.01); *G09G 2320/0626* (2013.01); *G09G 2360/144* (2013.01); *G09G 2360/16* (2013.01)
(58) Field of Classification Search
CPC ......... G09G 3/2003; G09G 2320/0626; G09G 2360/144; G09G 2360/16
(Continued)

(56) References Cited

U.S. PATENT DOCUMENTS 10,657,884 B2    5/2020  Jang et al.
11,175,824 B2   11/2021  Zhang et al.
(Continued)

FOREIGN PATENT DOCUMENTS

CN    107796512 A    3/2018
CN    107957294 A    4/2018
(Continued)

*Primary Examiner* — Jimmy H Nguyen
(74) *Attorney, Agent, or Firm* — Conley Rose, P.C.

(57) ABSTRACT

An ambient illumination intensity determining method and apparatus, and a storage medium are provided, and relate to the field of display technologies. In the method, a terminal device (20) includes a display (21, 304) and an ambient light sensor (12, 303), an ambient light detection area (211) is disposed in the display (21, 304), and the ambient light sensor (12, 303) is disposed in a coverage area of the ambient light detection area (211). When the display (21, 304) is turned on and an integration period of the ambient light sensor (12, 303) starts, a color value of a target color in the ambient light detection area (211) is determined; the ambient light detection area (211) is controlled to display the target color within the integration period; a first ambient illumination intensity is detected by the ambient light sensor (12, 303); a target impact value of both a brightness value of the display (21, 304) and the color value of the target color on the first ambient illumination intensity is determined; and the first ambient illumination intensity is corrected based on the target impact value to obtain a second ambient illumination intensity. In this way, the target color has a single color value, a target impact value calculation method is simple with high accuracy, and the obtained second ambient illumination intensity tends to be closer to a real ambient illumination intensity.

20 Claims, 10 Drawing Sheets

(58) Field of Classification Search
USPC .......................................................... 345/690
See application file for complete search history.

(56) References Cited

U.S. PATENT DOCUMENTS

| | | | |
|---|---|---|---|
| 11,295,653 | B2 | 4/2022 | Li et al. |
| 2005/0057484 | A1 | 3/2005 | Diefenbaugh et al. |
| 2014/0132578 | A1 | 5/2014 | Zheng |
| 2017/0039958 | A1 | 2/2017 | Ghosh et al. |
| 2017/0092228 | A1* | 3/2017 | Cote ..................... G09G 5/30 |
| 2019/0155501 | A1* | 5/2019 | Zhang ............... G06F 3/04847 |
| 2020/0294468 | A1* | 9/2020 | Hung ..................... G09G 5/10 |
| 2023/0206881 | A1 | 6/2023 | Zhou et al. |

FOREIGN PATENT DOCUMENTS

| | | | |
|---|---|---|---|
| CN | 108021161 | A | 5/2018 |
| CN | 108917921 | A | 11/2018 |
| CN | 110730262 | A | 1/2020 |
| CN | 111486950 | A | 8/2020 |
| CN | 111754954 | A | 10/2020 |
| CN | 112229507 | A | 1/2021 |
| CN | 112333335 | A | 2/2021 |
| CN | 113763856 | A | 12/2021 |
| CN | 114283743 | A | 4/2022 |

* cited by examiner

AMBIENT ILLUMINATION INTENSITY DETERMINING METHOD AND APPARATUS, AND STORAGE MEDIUM

CROSS-REFERENCE TO RELATED APPLICATIONS

This is a U.S. National Stage of International Application No. PCT/CN2022/094275 filed on May 20, 2022, which claims priority to Chinese Patent Application No. 202110815390.8 filed on Jul. 19, 2021, both of which are incorporated herein by reference in their entireties.

TECHNICAL FIELD

This application relates to the field of display technologies, and in particular, to an ambient illumination intensity determining method and apparatus, and a storage medium.

BACKGROUND

Power consumed by a display of a terminal device accounts for a large proportion of total power consumed by the terminal device, and brightness of the display affects energy consumption of the display.

Currently, an ambient light sensor (ALS) is disposed in the terminal device to perform ambient illumination intensity detection, and the terminal device may adjust the brightness of the display based on a detected ambient illumination intensity, to adapt to an environment in which the terminal device is located, thereby helping reduce overall energy consumption of the display. The ambient illumination intensity is used to indicate an illumination intensity of the environment in which the terminal device is located or an amount of illumination on the display of the terminal device.

However, accuracy of the ambient illumination intensity detected by the current terminal device is not high, and a difference exists between the detected ambient illumination intensity and an actual ambient illumination intensity.

SUMMARY

Embodiments of this application provide an ambient illumination intensity determining method and apparatus, and a storage medium, and relate to the field of display technologies, to help determine an ambient illumination intensity more accurately. The method includes:

According to a first aspect, an embodiment of this application provides an ambient illumination intensity determining method, applied to a terminal device. The terminal device includes a display and an ambient light sensor, an ambient light detection area is disposed in the display, and the ambient light sensor is disposed in a coverage area of the ambient light detection area. The method includes: when the display is turned on and an integration period of the ambient light sensor starts, determining a color value of a target color in the ambient light detection area, where the target color is used to represent a feature of a color in the ambient light detection area; controlling the ambient light detection area to display the target color within the integration period; detecting a first ambient illumination intensity by the ambient light sensor; determining a target impact value of both a brightness value of the display and the color value of the target color on the first ambient illumination intensity; and correcting the first ambient illumination intensity based on the target impact value to obtain a second ambient illumination intensity.

In this embodiment of this application, the terminal device displays the color in the ambient light detection area in the display as the target color in an ambient light collection time window, and calculates an impact value of both the color value of the target color and a preset screen brightness value in the ambient light collection time window on an ambient illumination intensity, and the terminal device corrects the detected ambient illumination intensity based on the impact value. In this way, the target color has a single color value. Therefore, an impact value calculation method is simple with high calculation accuracy, and the ambient illumination intensity corrected based on the calculated impact value tends to be closer to a real ambient illumination intensity.

In a possible implementation, the determining a target impact value of both a brightness value of the display and the color value of the target color on the first ambient illumination intensity includes: converting the color value of the target color to obtain a first brightness value corresponding to the color value of the target color; performing weighted summation on the first brightness value and the brightness value of the display based on preset weights to obtain a second brightness value; obtaining an ambient illumination intensity corresponding to the second brightness value from a plurality of preset first correspondences, where the first correspondence is a correspondence between a brightness value and an ambient illumination intensity; obtaining a quantity of frames of images displayed by the display within the integration period to obtain a sampling frequency; and determining a product of the ambient illumination intensity corresponding to the second brightness value and the sampling frequency as the target impact value.

In another possible implementation, the sampling frequency meets a formula as follows: the sampling frequency=the integration period*a screen refresh rate/1000. The screen refresh rate is a preset quantity of frames of images displayed by the display per second.

In another possible implementation, the determining a target impact value of both a brightness value of the display and the color value of the target color on the first ambient illumination intensity includes: obtaining the target impact value corresponding to both the brightness value of the display and the color value of the target color from a plurality of preset second correspondences (corresponding to the first correspondences in this embodiment), where the second correspondence is a correspondence among a brightness value, a color value, and an impact value. In this way, because the color in the ambient light detection area is the target color, the second correspondence can be obtained through experimental detection, and stored in the terminal device.

In another possible implementation, the determining a color value of a target color in the ambient light detection area includes: collecting color values of a plurality of locations in the ambient light detection area; and calculating an average value of the color values of the plurality of locations to obtain the color value of the target color. In this way, the target color obtained based on the color values of the plurality of locations can better reflect a color feature of the color displayed in the ambient light detection area, and displaying the ambient light detection area as the target color within the integration period does not cause the detection area to be not fused with a surrounding area of the detection area.

In another possible implementation, the determining a color value of a target color in the ambient light detection area includes: collecting a color value of any location in the ambient light detection area to obtain the color value of the target color.

In another possible implementation, the target impact value, the first ambient illumination intensity, and the second ambient illumination intensity meet a formula as follows: the second ambient illumination intensity+the target impact value=the first ambient illumination intensity; or the second ambient illumination intensity+the second ambient illumination intensity*the target impact value=the first ambient illumination intensity.

In another possible implementation, the method further includes: obtaining a target screen brightness value corresponding to the second ambient illumination intensity from a plurality of preset third correspondences, where the third correspondence is a correspondence between an ambient illumination intensity and a screen brightness value; and adjusting the brightness value of the display to the target screen brightness value. In this way, adjusted brightness of the display is more adapted to ambient light of a current environment, so that content displayed by the display is clearer and beneficial to eyes of a user.

In another possible implementation, the terminal device further includes an ambient light sensor control center and a target application. The method further includes: The ambient light sensor control center transmits a first indication message to the target application based on the preset integration period when the integration period starts, where the first indication message is used to indicate that the integration period starts.

In another possible implementation, the terminal device further includes a display engine. The determining a color value of a target color in the ambient light detection area includes: In response to the first indication message, the target application transmits a location of the ambient light detection area in the display to the display engine; and the display engine determines the color value of the target color in the ambient light detection area based on display content of the display and the location of the ambient light detection area in the display.

In another possible implementation, the method further includes: The display engine transmits the target impact value to the ambient light sensor control center; and the correcting the first ambient illumination intensity based on the target impact value to obtain a second ambient illumination intensity includes: The ambient light sensor control center corrects the first ambient illumination intensity based on the target impact value to obtain the second ambient illumination intensity.

In another possible implementation, the method further includes: The ambient light sensor control center transmits a second indication message to the target application, where the second indication message is used to indicate that the integration period ends; and the target application controls the display engine to stop triggering display of the ambient light detection area as the target color. In this way, the ambient light detection area is displayed as normal content within a non-integration period, to reduce a risk that the color displayed in the ambient light detection area does not fuse with a surrounding area of the ambient light detection area.

According to a second aspect, an embodiment of this application provides an ambient illumination intensity determining apparatus, including a processing unit, a display, and an ambient light sensor, where an ambient light detection area is disposed in the display, and the ambient light sensor is disposed in a coverage area of the ambient light detection area. When the display is turned on and an integration period of the ambient light sensor starts, the processing unit is configured to determine a color value of a target color in the ambient light detection area, where the target color is used to represent a feature of a color in the ambient light detection area. Within the integration period, the processing unit is configured to: control the ambient light detection area to display the target color, and detect a first ambient illumination intensity by using the ambient light sensor; determine a target impact value of both a brightness value of the display and the color value of the target color on the first ambient illumination intensity; and correct the first ambient illumination intensity based on the target impact value to obtain a second ambient illumination intensity.

Optionally, the processing unit is specifically configured to: convert the color value of the target color to obtain a first brightness value corresponding to the color value of the target color; perform weighted summation on the first brightness value and the brightness value of the display based on preset weights to obtain a second brightness value; obtain an ambient illumination intensity corresponding to the second brightness value from a plurality of preset first correspondences, where the first correspondence is a correspondence between a brightness value and an ambient illumination intensity; obtain a quantity of frames of images displayed by the display within the integration period to obtain a sampling frequency; and determine a product of the ambient illumination intensity corresponding to the second brightness value and the sampling frequency as the target impact value.

Optionally, the sampling frequency meets a formula as follows: the sampling frequency=the integration period*a screen refresh rate/1000. The screen refresh rate is a preset quantity of frames of images displayed by the display per second.

Optionally, the processing unit is specifically configured to obtain the target impact value corresponding to both the brightness value of the display and the color value of the target color from a plurality of preset second correspondences (corresponding to the first correspondences in this embodiment), where the second correspondence is a correspondence among a brightness value, a color value, and an impact value. In this way, because the color in the ambient light detection area is the target color, the second correspondence can be obtained through experimental detection, and stored in the terminal device.

Optionally, the processing unit is specifically configured to: collect color values of a plurality of locations in the ambient light detection area; and calculate an average value of the color values of the plurality of locations to obtain the color value of the target color.

Optionally, the processing unit is specifically configured to collect a color value of any location in the ambient light detection area to obtain the color value of the target color.

Optionally, the target impact value, the first ambient illumination intensity, and the second ambient illumination intensity meet a formula as follows: the second ambient illumination intensity+the target impact value=the first ambient illumination intensity; or the second ambient illumination intensity+the second ambient illumination intensity*the target impact value=the first ambient illumination intensity.

Optionally, the processing unit is further configured to: obtain a target screen brightness value corresponding to the second ambient illumination intensity from a plurality of preset third correspondences, where the third correspondence is a correspondence between an ambient illumination intensity and a screen brightness value; and adjust the brightness value of the display to the target screen brightness value.

Optionally, the processing unit includes an ambient light sensor control center and a target application. The ambient light sensor control center is configured to transmit a first indication message to the target application based on the preset integration period when the integration period starts, where the first indication message is used to indicate that the integration period starts.

Optionally, the processing unit further includes a display engine. The target application is configured to transmit, in response to the first indication message, a location of the ambient light detection area in the display to the display engine; and the display engine is configured to determine the color value of the target color in the ambient light detection area based on display content of the display and the location of the ambient light detection area in the display.

Optionally, the display engine is configured to transmit the target impact value to the ambient light sensor control center; and the ambient light sensor control center is configured to correct the first ambient illumination intensity based on the target impact value to obtain the second ambient illumination intensity.

Optionally, the ambient light sensor control center is further configured to transmit a second indication message to the target application, where the second indication message is used to indicate that the integration period ends; and the target application is configured to control the display engine to stop triggering display of the ambient light detection area as the target color.

According to a third aspect, an embodiment of this application provides a computer-readable storage medium. The computer-readable storage medium stores a computer program or instructions. When the computer program or instructions are run on a computer, the computer is enabled to perform the method performed by the terminal device in the ambient illumination intensity determining method described in the first aspect or any possible implementation of the first aspect.

According to a fourth aspect, an embodiment of this application provides a computer program product including a computer program. When the computer program is run on a computer, the computer is enabled to perform the method performed by the terminal device in the ambient illumination intensity determining method described in the first aspect or any possible implementation of the first aspect.

According to a fifth aspect, this application provides a chip or a chip system. The chip or the chip system includes at least one processor and a communication interface. The communication interface and the at least one processor are interconnected by using a line. The at least one processor is configured to run a computer program or instructions, to perform the method performed by the terminal device in the ambient illumination intensity determining method described in the first aspect or any possible implementation of the first aspect. The communication interface in the chip may be an input/output interface, a pin, a circuit, or the like.

In a possible implementation, the chip or the chip system described above in this application further includes at least one memory, and the at least one memory stores instructions. The memory may be a storage unit inside the chip, for example, a register or a cache, or may be a storage unit of the chip (for example, a read-only memory or a random access memory).

According to a sixth aspect, an embodiment of this application provides an electronic device. The electronic device includes a memory and a processor, the memory is configured to store a computer program, and the processor is configured to execute the computer program, to perform the method performed by the terminal device in the ambient illumination intensity determining method described in the first aspect or any possible implementation of the first aspect.

It should be understood that technical solutions of the second aspect to the sixth aspect of this application correspond to those of the first aspect of this application, and beneficial effects achieved in these aspects and corresponding feasible implementations are similar. Details are not described again.

DESCRIPTION OF EMBODIMENTS

Figure 1:
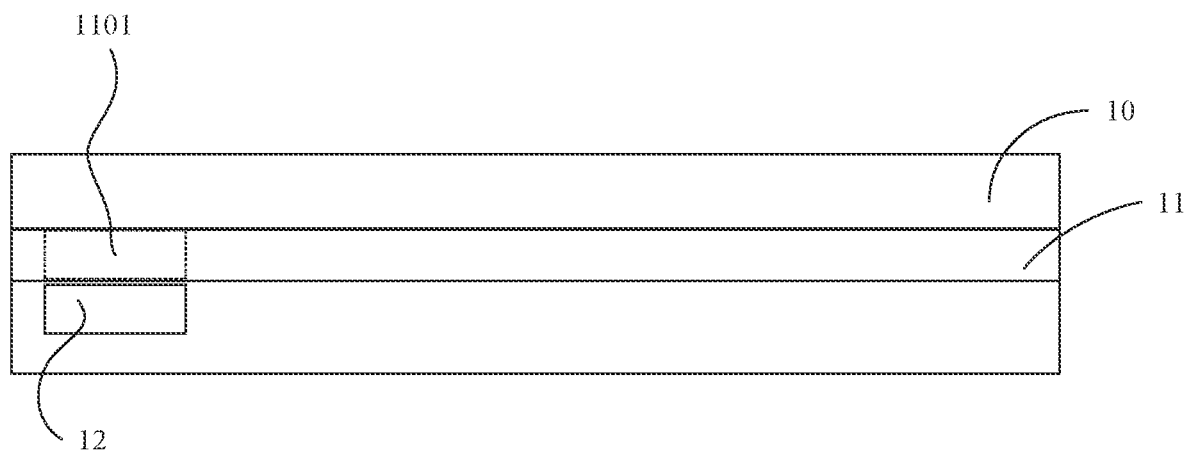
FIG. 1 is a schematic diagram of a longitudinal section of locations of a display and an ambient light sensor in an electronic device to which an embodiment of this application is applicable.

To clearly describe the technical solutions in the embodiments of this application, the following briefly describes some terms and technologies related to the embodiments of this application.

1) Illumination Intensity and Ambient Illumination Intensity

An illumination intensity refers to a luminous flux of visible light received per unit area. The illumination intensity is used to indicate an intensity of illumination or an amount of illumination on a surface area of an object. A unit of the illumination intensity is lux (lux or lx).

An ambient illumination intensity refers to a luminous flux of visible light received per unit area in an environment.

2) Ambient Light Sensor, System Coprocessor (SCP), and Ambient Light Collection Time Window An ambient light sensor is a sensing device, and the ambient light sensor may be configured to detect an ambient illumination intensity. For example, an ambient light sensor to which an embodiment of this application is applicable may include a photodiode, an analog to digital converter (ADC), a memory, and the like. The photodiode is configured to convert a received optical signal into a current, and the ADC is configured to integrate the current from the photodiode, and convert, into light sensing data represented by a digital signal, power obtained by integrating the current.

The system coprocessor may include an ambient light sensor, an ambient light sensor control center, a coprocessor, a memory, and the like. The coprocessor is a chip. The memory may be integrated with the coprocessor, or may be a separate memory. The memory stores a drive program of the ambient light sensor and program code for implementing the ambient light sensor control center. An integration period and first preset duration may be preset in the memory. The coprocessor implements enable/disable control on the ambient light sensor based on the integration period and the first preset duration that are preset. The ambient light sensor control center may be configured to process an ambient illumination intensity detected by the ambient light sensor.

An ambient light collection time window is an integration period that is of the light sensing data of the ambient light sensor and that is preset in the system coprocessor. Within the integration period, the ADC in the ambient light sensor integrates the current from the photodiode, and converts, into the light sensing data represented by the digital signal, the power obtained by integrating the current. When the integration period ends, the coprocessor controls the ambient light sensor to transmit the obtained light sensing data to the memory. The memory may be a data register. After transmission is completed, the ambient light sensor may receive an instruction from the coprocessor after the first preset duration, and the instruction is used to instruct the ambient light sensor to start a next integration period. For example, the ambient light collection time window is 50 ms. It may be understood that the coprocessor may alternatively control the ambient light sensor to enter the next integration period without waiting for the first preset duration, although power consumption can be reduced by waiting for the first preset duration.

3) Ambient Light Detection Area

An ambient light detection area is an area that is preset in a display and through which ambient light can pass. The ambient light detection area is used for the ambient light to pass through to reach an ambient light sensor under the display. FIG. 1 is a schematic diagram of a longitudinal section of locations of a display and an ambient light sensor in an electronic device. In FIG. 1, the display 11 may be disposed under a front glass 10, and an ambient light sensor 12 is disposed under a small area 1101 of the display 11. This part of area 1101 that is of the display 11 and through which ambient light can pass is an ambient light detection area.

4) Color Mode and Color Value

A color mode is a model that represents a specific color in a numerical form. Color modes include a red green blue (RGB) mode, a hue saturation brightness (HSB) mode, a bitmap mode, a grayscale mode, an index color mode, a duotone mode, a multi-channel mode, and the like. A color value is a quantized value used to represent a color in a specific color mode. For example, in an RGB color mode, the color value may be represented by using an R value, a G value, and a B value. It should be noted that a color mode of a terminal device is not limited in the embodiments of this application. The following uses the RGB color mode as an example for description.

5) Screen Refresh Rate and Sampling Frequency

A screen refresh rate is a quantity of frames of displayed images refreshed by a display per second.

A sampling frequency is a quantity of frames of images displayed by the display in an ambient light collection time window. The sampling frequency meets a formula: the sampling frequency=the ambient light collection time window*the screen refresh rate/1000.

6) Other Terms

In the embodiments of this application, words such as "first" and "second" are used to distinguish between same items or similar items with basically the same functions and effects. For example, a first chip and a second chip are merely used to distinguish between different chips, and are not intended to limit a sequence thereof. A person skilled in the art may understand that the words such as "first" and "second" do not limit a quantity and an execution sequence, and the words such as "first" and "second" do not indicate a definite difference.

It should be noted that in the embodiments of this application, a word such as "as an example" or "for example" is used to represent an example, an illustration, or a description. Any embodiment or design solution described as "as an example" or "for example" in this application should not be construed as being preferred or advantageous over other embodiments or design solutions. Exactly, use of the word such as "as an example" or "for example" is intended to present related concepts in a specific manner.

In the embodiments of this application, "at least one" means one or more, and "a plurality of" means two or more. The term "and/or" is used to describe an association relationship between associated objects, and indicates that three relationships may exist. For example, A and/or B may indicate the following cases: Only A exists, both A and B exist, and only B exists, where A and B may be singular or plural. The character "/" usually indicates an "or" relationship between the associated objects. "At least one of the following items" or a similar expression thereof means any combination of these items, including any combination of a single item or a plurality of items. For example, at least one of a, b, or c may indicate a, b, c, a-b, a-c, b-c, or a-b-c, where a, b, and c may be singular or plural.

An ambient light sensor may be disposed in a terminal device. After a display of the terminal device is turned on, the ambient light sensor may detect an ambient illumination intensity of an environment in which the terminal device is located at an interval of a preset time period. When the ambient illumination intensity of the environment in which the terminal device is located changes, the terminal device may adjust brightness of the display with reference to the ambient illumination intensity. For example, when the terminal device whose display is turned on is moved from an environment with bright light to an environment with dim light, the ambient light sensor in the terminal device detects that the ambient illumination intensity decreases, and the terminal device turns down the brightness of the display. In this way, energy consumption of the terminal device can be reduced, and irritation of the display to eyes of a user of the terminal device can be reduced.

Figure 2:
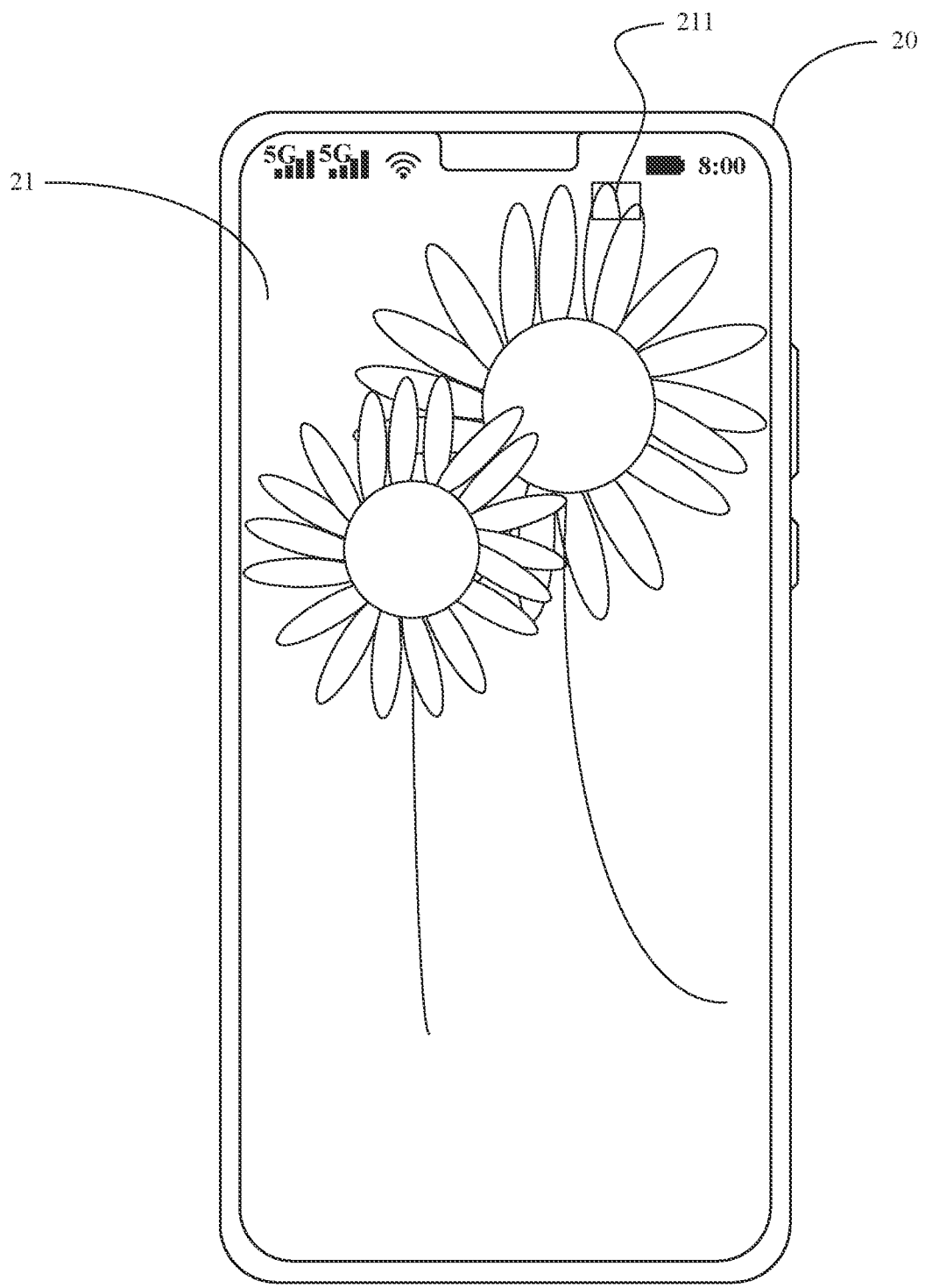
FIG. 2 is a schematic diagram of a location of an ambient light detection area in a display in a terminal device to which an embodiment of this application is applicable.

As shown in FIG. 2, an ambient light sensor may be disposed under an ambient light detection area 211 of a display 21 of a terminal device 20. The ambient light detection area 211 allows ambient light to pass through the display 21 to reach the ambient light sensor. In FIG. 2, the ambient light detection area 211 of the terminal device 20 displays content, and is not transparent. An ambient illumination intensity detected by the ambient light sensor is affected by a preset screen brightness value of the display 21 of the terminal device 20 and a brightness value of a color displayed by the display 21, and a difference exists between the ambient illumination intensity detected by the ambient light sensor and an actual ambient illumination intensity. In this case, adjustment performed on brightness of the display by the terminal device may be inaccurate.

Figure 3:
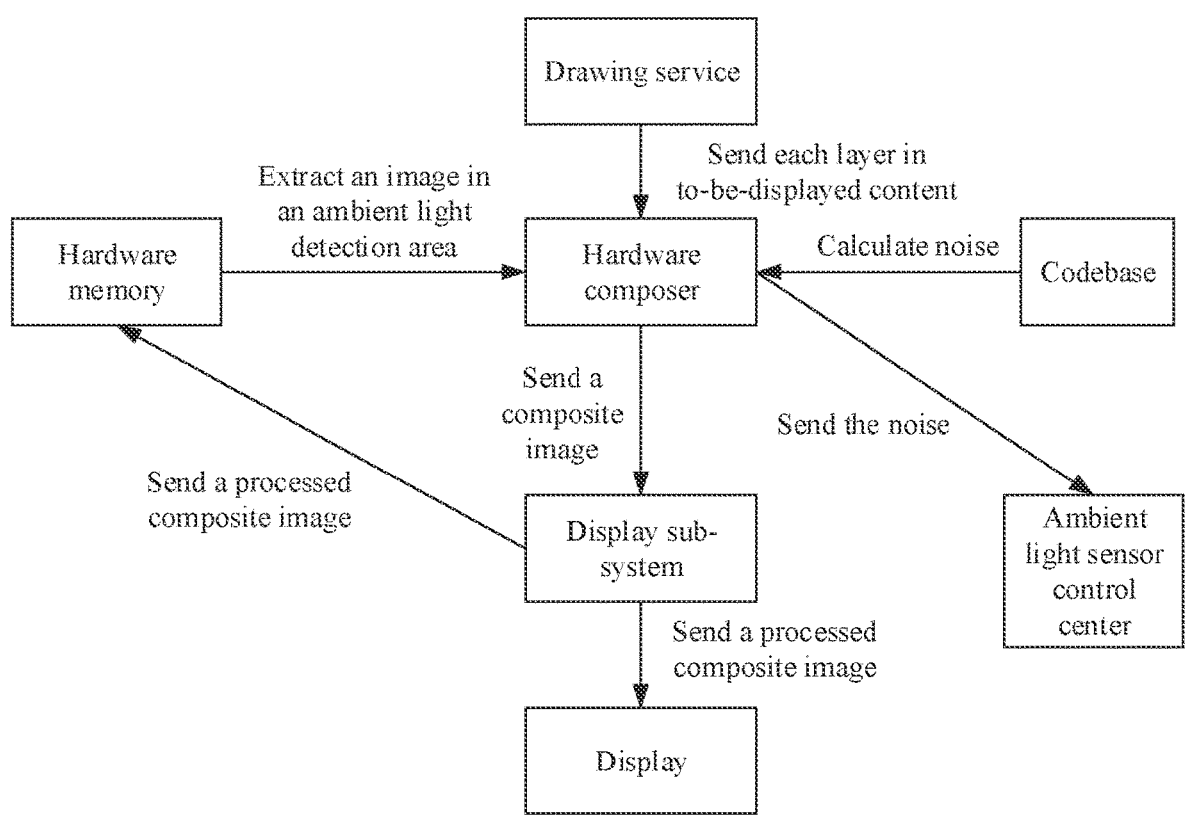
FIG. 3 is a schematic flowchart of an ambient illumination intensity determining method in a hardware implementation.

In a related technology, a procedure of a possible hardware implementation of determining an ambient illumination intensity is shown in FIG. 3. In FIG. 3, an application in a terminal device invokes a drawing service, for example, surfaceFlinger, to obtain to-be-displayed content of the terminal device (for example, layers in the to-be-displayed content), and sends the to-be-displayed content to a hardware composer (HWC). The HWC composes and processes the layers in the to-be-displayed content into one frame of composite image, and sends the frame of composite image to a display sub-system (DSS). The DSS performs filtering, enhancement, noise reduction processing, or the like on the composite image, and displays a processed composite image to a user by using a display. In addition, the DSS sends the processed composite image to a memory for storage. The memory may be a concurrent write back double data rate (CWB DDR) memory. In this way, the HWC reads the stored processed composite image, and extracts an image in an ambient light detection area from the processed composite image. The HWC calculates noise by using a noise calculation method prestored in a codebase, where the noise is an impact value of both a color value of the image in the ambient light detection area and a preset screen brightness value on an ambient illumination intensity detected by an ambient light sensor. The HWC sends the calculated noise to an ambient light sensor control center. The noise is used by the ambient light sensor control center to correct the detected ambient illumination intensity, and a corrected ambient illumination intensity is an ambient illumination intensity determined by the terminal device.

In the foregoing hardware implementation of determining the ambient illumination intensity, the terminal device may obtain the noise in an ambient light collection time window in a unit time, and correct the detected ambient illumination intensity based on the noise. In this way, the ambient illumination intensity can be more accurately determined. However, HWCs and DSSs in hardware of many terminal devices do not support storage of a processed composite image and extraction of an image of an ambient light detection area of the processed composite image. Consequently, an ambient illumination intensity detected by an ambient light sensor cannot be corrected in a hardware manner.

Figure 4:
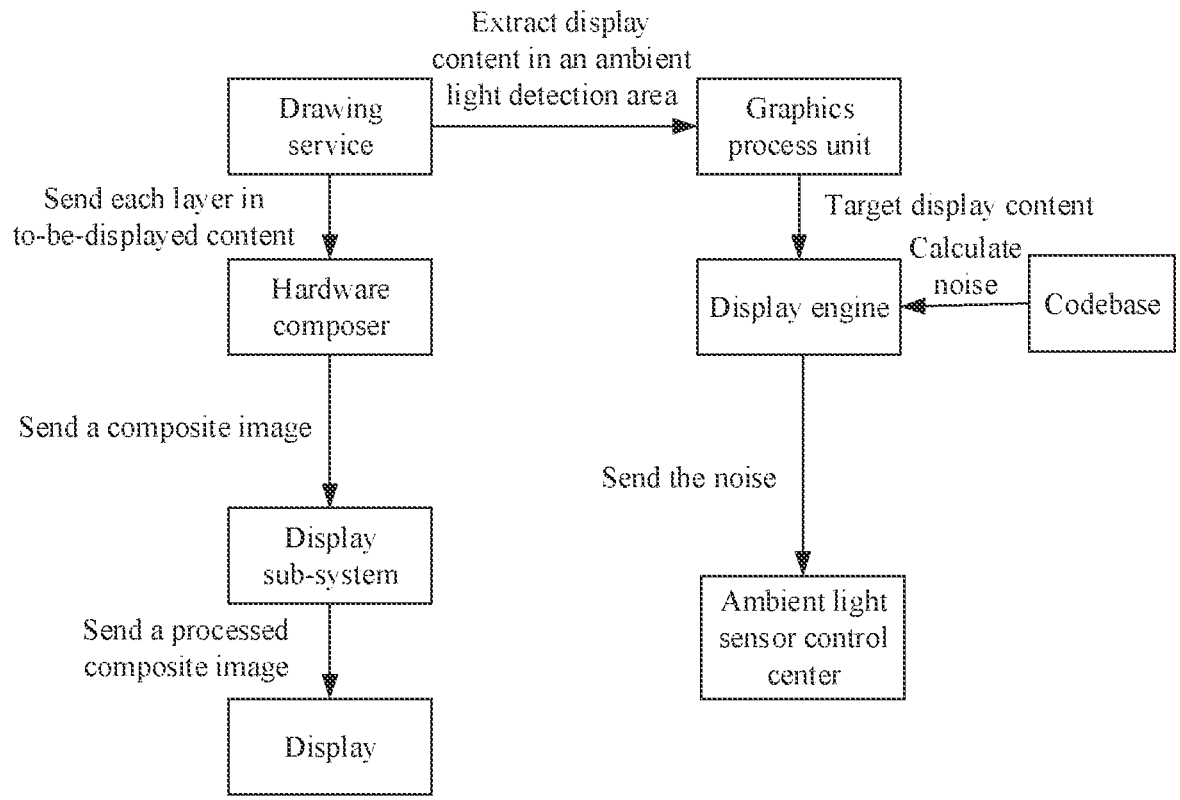
FIG. 4 is a schematic flowchart of an ambient illumination intensity determining method in a software implementation.

Currently, a possible software implementation of determining an ambient illumination intensity is shown in FIG. 4. The implementation shown in FIG. 4 is used to compensate for a defect that hardware of a terminal device cannot correct a detected ambient illumination intensity.

A drawing service in the terminal device in FIG. 4, for example, surfaceFlinger, obtains to-be-displayed content of the terminal device (for example, layers in the to-be-displayed content), and sends the content that needs to be displayed to a hardware composer (HWC). The HWC composes and processes the layers in the to-be-displayed content into one frame of composite image, and sends the frame of composite image to a DSS. The DSS performs filtering, enhancement, noise reduction processing, or the like on the composite image, and displays a processed composite image to a user by using a screen. When the terminal device sends the to-be-displayed content to the hardware composer, the terminal device extracts display content of an ambient light detection area in the to-be-displayed content by using a graphics process unit (GPU), composes layers in the extracted display content to obtain target display content, and performs filtering, enhancement, noise reduction processing, or the like on the target display content by using a display engine, to simulate processing performed on the composite image by the DSS. The display engine is image processing software, and an image processing interface is encapsulated in the display engine. The display engine may be configured to process complex to-be-displayed content in the terminal device. The terminal device calculates noise of processed target display content, and transmits the calculated noise to an ambient light sensor control center, so that the ambient light sensor control center corrects a detected ambient illumination intensity based on the noise.

In the software implementation, content that needs to be implemented by software of the terminal device includes: composing the layers in the extracted to-be-displayed content to obtain the target display content, performing filtering, enhancement, or noise reduction processing on the target display content by using the display engine, calculating the noise of the processed target display content, and the like. The software implementation has a complex procedure and a high GPU load.

Based on this, an embodiment of this application provides an ambient illumination intensity determining method. In the method, when a terminal device collects an ambient illumination intensity, a target color in an ambient light detection area of a display is sampled, and the target color is used to represent a feature of a color in the ambient light detection area. In a process of collecting the ambient illumination intensity, the terminal device uses the target color to replace the color of the ambient light detection area. The terminal device obtains an impact value of both a color value of the target color and a preset screen brightness value on the collected ambient illumination intensity in the process of collecting the ambient illumination intensity, and corrects, based on the impact value, the ambient illumination intensity detected by an ambient light sensor, to obtain a corrected ambient illumination intensity.

In this way, the corrected ambient illumination intensity obtained by the terminal device tends to be closer to an ambient illumination intensity of an environment in which the terminal device is located, thereby improving accuracy of the ambient illumination intensity determined by the terminal device. Compared with the foregoing software implementation, in this embodiment of this application, the ambient light detection area is displayed as one color in a process in which the terminal device collects ambient light. The terminal device does not need to extract display content of the ambient light detection area by using a graphics process unit and compose the display content, and does not need to simulate a DSS to perform filtering, enhancement, noise reduction processing, or the like on the display content of the ambient light detection area, thereby simplifying a software procedure and reducing a GPU load.

Figure 5:
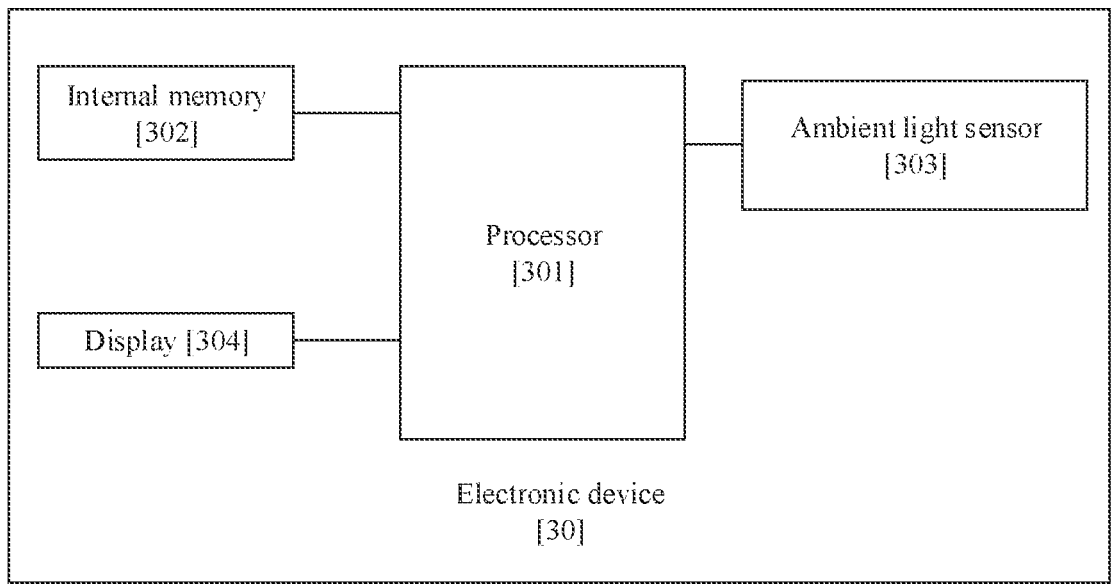
FIG. 5 is a schematic diagram of a structure of an electronic device to which an embodiment of this application is applicable.

FIG. 5 is a schematic diagram of a structure of an electronic device to which an embodiment of this application is applicable. As shown in FIG. 5, the electronic device 30 may include a processor 301, an internal memory 302, an ambient light sensor 303, a display 304, and the like. It may be understood that a structure illustrated in this embodiment does not constitute a specific limitation on the electronic device 30. In some other embodiments of this application, the electronic device 30 may include more or fewer components than those shown in the figure, combine some components, split some components, or have different component arrangements. The components shown in the figure may be implemented by hardware, software, or a combination of software and hardware.

The processor 301 may include one or more processing units. For example, the processor 301 may include an application processor (AP), a modem processor, a graphics process unit, an image signal processor (ISP), a controller, a video codec, a digital signal processor (DSP), a baseband processor, a display process unit (DPU), and a coprocessor, for example, a smart sensor hub and/or a neural-network processing unit (NPU). Different processing units may be independent devices or may be integrated into one or more processors. In some embodiments, the electronic device 30 may alternatively include one or more processors 301. The processor may be a nerve center and a command center of the electronic device 30. The processor may generate an operation control signal based on instruction operation code and a timing signal, to complete control of instruction fetching and instruction execution. A memory may be further disposed in the processor 301, and is configured to store instructions and data. In some embodiments, the memory in the processor 301 is a cache. The memory may store instructions or data used or cyclically used by the processor 301. If the processor 301 needs to use the instructions or the data again, the instructions or the data may be directly invoked from the memory. Therefore, repeated access is avoided, and a waiting time of the processor 301 is shortened, thereby improving efficiency of the electronic device 30.

In some embodiments, the sensor hub may include a plurality of drive programs for controlling sensors. For example, the sensor hub includes a drive program for controlling the ambient light sensor, and the sensor hub may control the ambient light sensor by using the drive program.

The electronic device 30 may implement a display function by using the GPU, the display 304, the application processor, and the like. The application processor may include an NPU and a DPU. The GPU is an image processing microprocessor, and is connected to the display 304 and the application processor. The GPU is configured to perform mathematical and geometric calculation for graphics rendering. The processor 301 may include one or more GPUs. The one or more GPUs execute instructions to generate or change display information. The NPU is a neural-network (NN) computing processor that quickly processes input information by referring to a biological neural network structure, for example, by referring to a transmission mode between human brain neurons, and may further perform self-learning continuously. Applications such as intelligent cognition of the electronic device 30, for example, image recognition, face recognition, voice recognition, and text understanding, may be implemented by using the NPU. The DPU is also referred to as a display sub-system. The DPU is configured to adjust a color of the display 304, and the DPU may adjust the color of the display by using a three-dimensional look up table (3D LUT). The DPU may further perform processing such as scaling, noise reduction, contrast enhancement, backlight brightness management, hdr processing, and display parameter Gamma adjustment on a picture.

The display 304 is configured to display an image, a video, or the like. The display 304 includes a display panel. The display panel may be a liquid crystal display (LCD), an organic light-emitting diode (OLED), an active-matrix organic light emitting diode or an active-matrix organic light emitting diode (AMOLED), a flexible light-emitting diode (FLED), a Miniled, a MicroLed, a Micro-oLed, or a quantum dot light emitting diode (QLED). In some embodiments, the electronic device 30 may include one or N displays 304, where N is a positive integer greater than 1.

The internal memory 302 may be configured to store one or more computer programs, and the one or more computer programs include instructions. The processor 301 may run the instructions stored in the internal memory 302, to enable the electronic device 30 to perform various function applications, data processing, and the like. The internal memory 302 may include a program storage area and a data storage area. The program storage area can store an operating system. The program storage area can further store one or more applications (for example, Gallery and Contacts), and the like. The data storage area may store data (for example, a photo and a contact) and the like created when the electronic device 30 is used. In addition, the internal memory 302 may include a high-speed random access memory, and may further include a non-volatile memory, for example, at least one magnetic disk storage device, a flash memory device, or a universal flash storage (UFS). In some embodiments, the processor 301 may run the instructions stored in the internal memory 302 and/or the instructions stored in the memory disposed in the processor 301, to enable the electronic device 30 to perform various function applications and data processing.

The internal memory 302 is configured to store the detected ambient illumination intensity, an ambient light collection time window, a screen refresh rate, a sampling frequency, the ambient light detection area, a first correspondence to a third correspondence, and the like in this embodiment of this application, where the first correspondence is a correspondence among a brightness value, a color value, and an impact value, the second correspondence is a correspondence between a brightness value and an ambient illumination intensity, and the third correspondence is a correspondence between an illumination intensity and a screen brightness value. The first correspondence to the third correspondence may be obtained through analysis of experimental data.

The ambient light sensor 303 is configured to detect an illumination intensity of the environment in which the electronic device 30 is located, and inform the processor 301 to adjust brightness of the display 304, thereby reducing power consumption of the electronic device 30.

Figure 6:
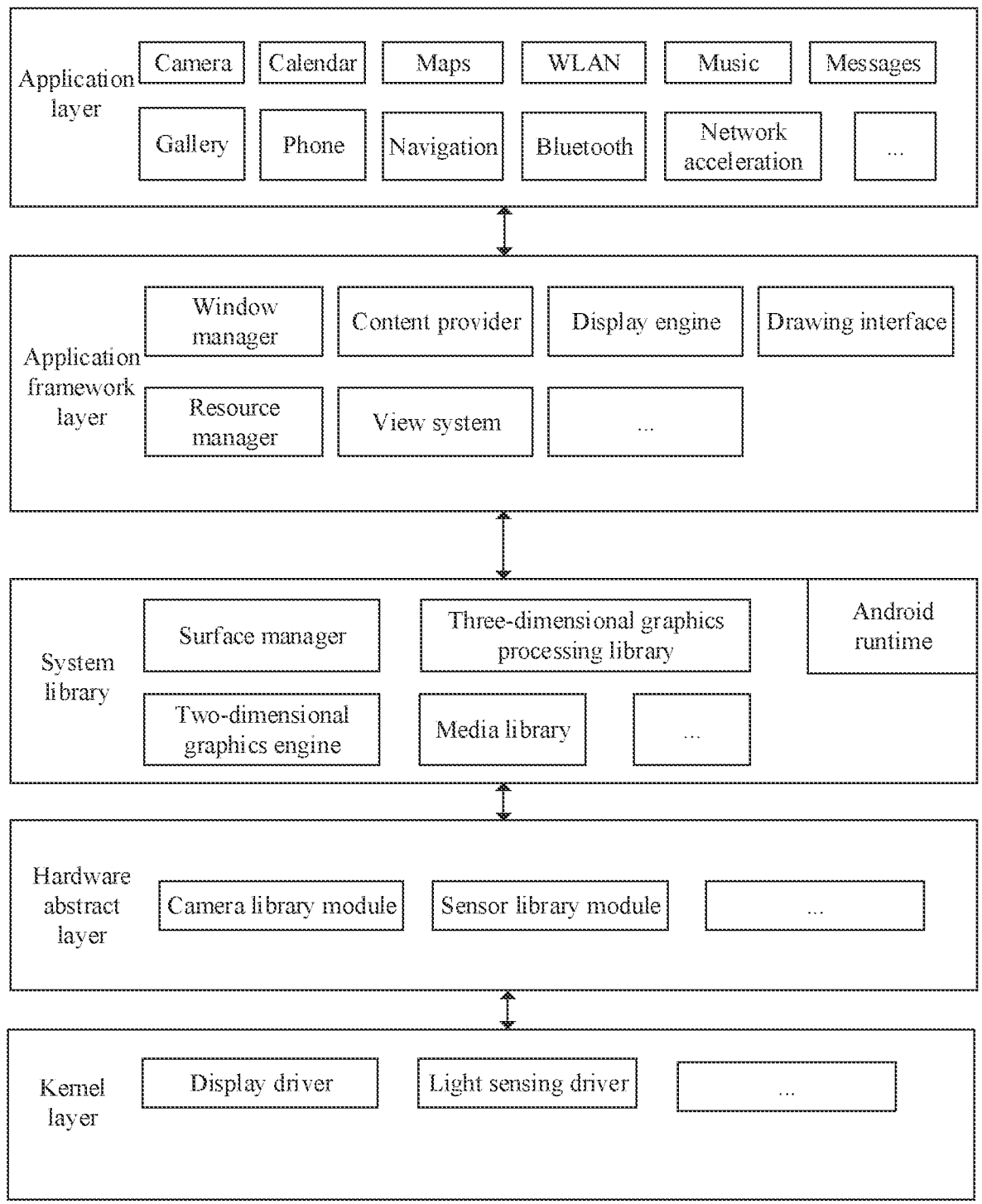
FIG. 6 is a block diagram of a software structure of an electronic device to which an embodiment of this application is applicable.

The display 304 the display 304. A software system of the electronic device 30 may use a hierarchical architecture, an event-driven architecture, a microkernel architecture, a micro service architecture, or a cloud architecture. In this embodiment of this application, an Android system with a hierarchical architecture is used as an example to describe a software structure of the electronic device 30. FIG. 6 is a block diagram of a software structure of an electronic device to which an embodiment of this application is applicable. A hierarchical architecture divides a software system of the electronic device 30 into several layers, and each layer has a clear role and division of labor. The layers communicate with each other through a software interface. In some embodiments, an Android system may be divided into five layers, which are respectively an application layer, an application framework layer, Android runtime and a system library (also referred to as a codebase), a hardware abstract layer (HAL), and a kernel layer.

The application layer may include a series of application packages. The application layer runs an application by invoking an application programming interface (application programming interface, API) provided by the application framework layer. As shown in FIG. 6, the application packages may include applications such as Camera, Gallery, Calendar, Calls, Maps, Navigation, WLAN, Bluetooth, Music, Videos, and Messages.

The application framework layer provides the API and a programming framework for the applications at the application layer. The application framework layer includes some predefined functions, for example, the display engine of the foregoing terminal device. As shown in FIG. 6, the application framework layer may include a window manager, a content provider, a view system, a display engine, a drawing interface, a resource manager, a notification manager, and the like.

The window manager is configured to manage a window program. The window manager may obtain a display size, determine whether there is a status bar, lock a screen, take a screenshot, and the like.

The content provider is configured to store and obtain data, and enable the data to be accessible by an application. The data may include a video, an image, audio, calls that are made and answered, browsing history and bookmarks, a phone book, and the like.

The view system includes visual controls, for example, a control for displaying a text and a control for displaying a picture. The view system may be configured to create an application. A display interface may include one or more views. For example, a display interface including an SMS message notification icon may include a view for displaying a text and a view for displaying a picture.

The display engine may be configured to process to-be-displayed content. For example, the display engine may invoke preset code in the system library to sample color values of a plurality of locations in an ambient light collection area, and calculate an average value of a plurality of color values.

The resource manager provides various resources for an application, for example, a localized string, an icon, a picture, a layout file, and a video file. The drawing interface may be invoked by an application at the application layer to implement a drawing function, and the drawing interface invokes a graphics engine in a core library to implement drawing.

The Android runtime includes a core library and a virtual machine. The Android runtime is responsible for scheduling and management of the Android system. The core library includes two parts: One part is a function that needs to be invoked by a java language, and the other part is a core library of Android. The application layer and the application framework layer run on the virtual machine. The virtual machine executes java files at the application layer and the application framework layer as binary files. The virtual machine is configured to perform functions such as lifecycle management of an object, stack management, thread management, security and exception management, and garbage collection. The system library may include a plurality of functional modules, for example, a surface manager, a media library, a three-dimensional graphics processing library (for example, OpenGL ES), and a 2D graphics engine (for example, SGL).

The surface manager is configured to manage a display sub-system, and provide fusion of 2D and 3D layers for a plurality of applications. The media library supports playback and recording in a plurality of common audio and video formats, a still image file, and the like. The media library may support a plurality of audio and video coding formats, for example, MPEG4, H.264, MP3, AAC, AMR, JPG, and PNG. The three-dimensional graphics processing library is used to implement three-dimensional graphics drawing, image rendering, composition, layer processing, and the like. The 2D graphics engine is a drawing engine for 2D drawing.

The hardware abstract layer may include a plurality of library modules. The library modules may be, for example, a camera library module and a sensor library module. The Android system may load a corresponding library module for device hardware, to implement accessing of the device hardware by the application framework layer. The device hardware may include, for example, a sensor in the electronic device 30.

The kernel layer is a layer between hardware and software. The kernel layer is used to drive hardware, so that the hardware works. The kernel layer includes at least a display driver, a light sensing driver, and the like. This is not limited in this embodiment of this application. For example, in this embodiment of this application, the kernel layer drives, by using the light sensing driver, the ambient light sensor to read ambient light data and calculate an ambient illumination intensity. The ambient light data includes C/R/G/B channel components in ambient light. In addition, the ambient illumination intensity is reported to the application framework layer, the application framework layer calculates a display brightness value based on different ambient illumination intensities, and then transmits the display brightness value to the display driver to drive the display in the electronic device 30 to change the brightness.

The electronic device to which this embodiment of this application is applicable may be a mobile terminal, or may be referred to as user equipment (UE), a mobile station (MS), or the like. The electronic device may be a device that provides a voice and/or a data connection to a user, or a chip disposed in the device. The electronic device may include: an in-vehicle terminal, a mobile phone, a tablet computer, a notebook computer, a palmtop computer, a mobile Internet device (MID), a wearable device, a virtual reality (VR) device, an augmented reality (AR) device, a wireless terminal in industrial control, a wireless terminal in unmanned driving, a wireless terminal in remote surgery, a wireless terminal in a smart grid, a wireless terminal in transport security, a wireless terminal in a smart city, a wireless terminal in a smart home, or the like.

The following describes, in detail by using specific embodiments, the technical solutions of this application and how the foregoing technical problems are resolved by using the technical solutions of this application. The following several specific embodiments may be implemented independently, or may be combined with each other. For same or similar concepts or processes, details may not be described in some embodiments again.

Figure 7:
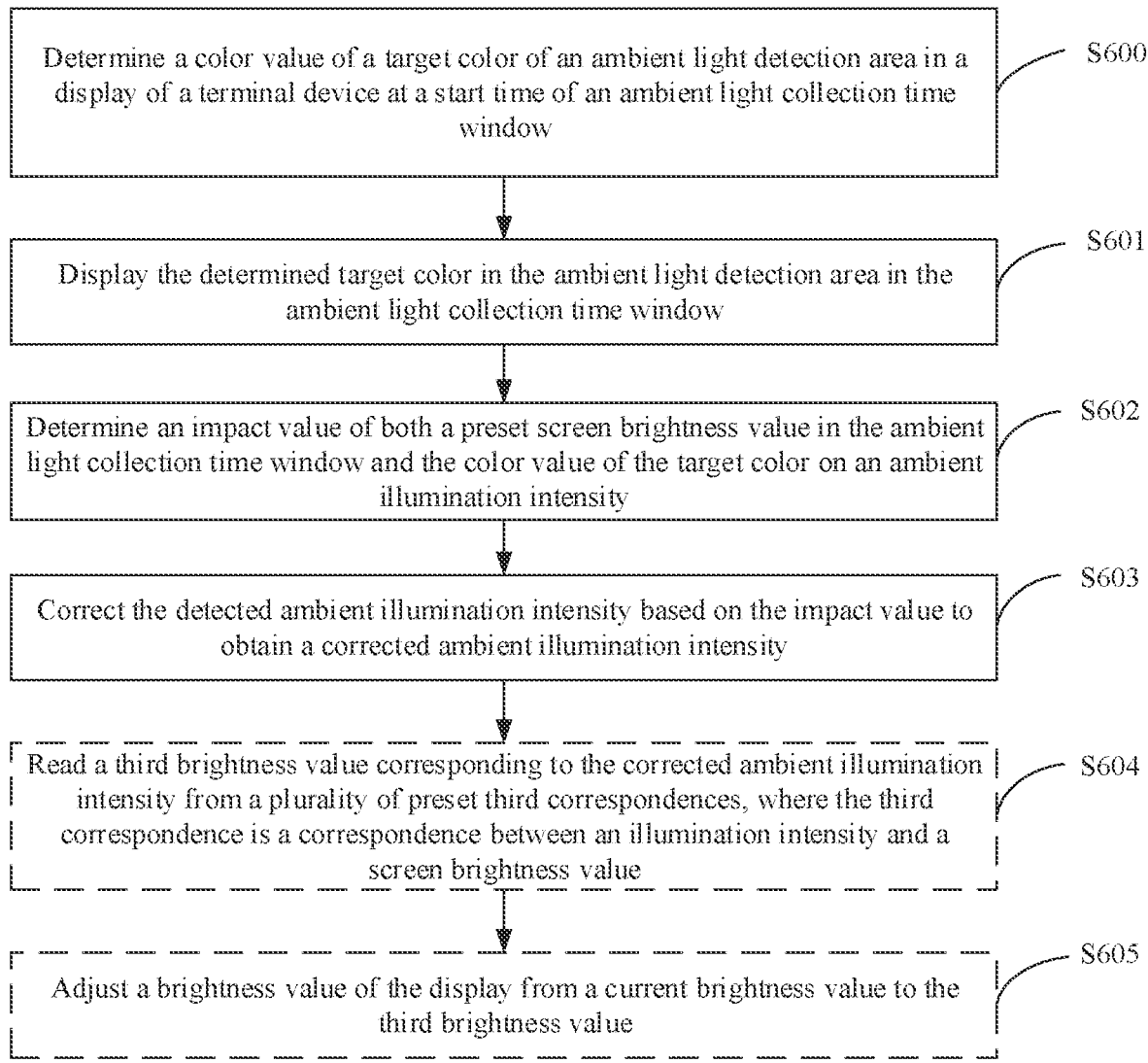
FIG. 7 is a schematic flowchart of an ambient illumination intensity determining method according to an embodiment of this application.

FIG. 7 is a schematic flowchart of an ambient illumination intensity determining method according to an embodiment of this application. FIG. 7 includes:

S600: A terminal device determines a color value of a target color of an ambient light detection area in a display of the terminal device at a start time of an ambient light collection time window.

The ambient light collection time window is an integration period that is of light sensing data of an ambient light sensor and that is preset in the terminal device. The terminal device may include a system coprocessor. An ambient light sensor control center in the system may control, based on the preset integration period, the ambient light sensor to start current integration when the integration period starts and to complete current integration when the integration period ends.

The target color is used to represent a feature of a color in the ambient light detection area at the start time of the ambient light collection time window. Before the ambient light collection time window starts, the terminal device may collect a color value of at least one of colors displayed in the ambient light detection area, and determine the target color based on the collected color value.

In a possible implementation, a coprocessor sends a first indication message to a target application before the integration period starts. The coprocessor is a coprocessor in the system coprocessor. The first indication message is used to indicate the target application to send a preset location of the ambient light detection area to a display engine. The display engine invokes, based on current display content of the display of the terminal device and the location of the ambient light detection area, code in a preset codebase to collect color values of a plurality of locations in the ambient light detection area, and calculates an average value of the color values of the plurality of locations. In this case, the terminal device determines that the color value of the target color is the average value.

The plurality of locations may be a preset quantity of locations randomly obtained by the terminal device from the ambient light detection area, or may be a plurality of locations evenly obtained by the terminal device from the ambient light detection area based on a preset distance.

Figure 8:
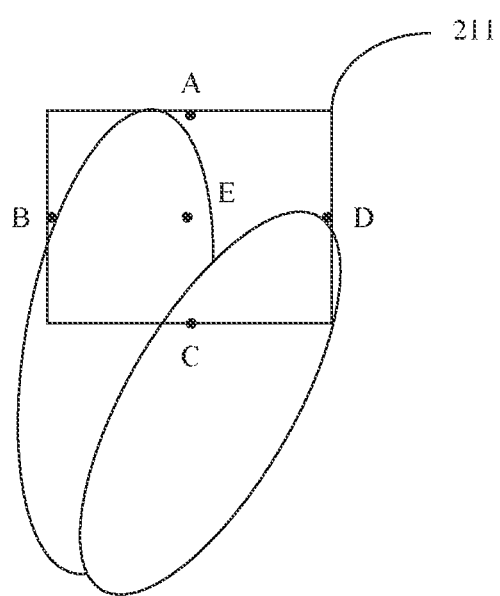
FIG. 8 is a schematic diagram of a plurality of locations in an ambient light detection area according to an embodiment of this application.

For example, the color values that are of the plurality of locations in the ambient light detection area and that are collected by the terminal device are shown in FIG. 8. As shown in FIG. 8, an RGB value that is of a color of a location A in an ambient light detection area 211 and that is collected by the terminal device is (220, 220, 220), an RGB value of a color of a location B is (192, 192, 192), an RGB value of a color of a location C is (169, 169, 169), an RGB value of a color of a location D is (112, 128, 144), and an RGB value of a color of a location E is (188, 143, 143). The terminal device calculates an average value of R values of the colors of the location A to the location E as (220+192+169+112+188)/5=176.2, calculates an average value of G values as (220+192+169+128+143)/5=170.4, and calculates an average value of B values as (220+192+169+144+143)/5=173.6. Because each number in the RGB value is an integer, the terminal device may perform rounding on numbers after a decimal point in the obtained average value. For example, the terminal device performs rounding on the numbers after the decimal point in the obtained average value to obtain an RGB value (176, 170, 174) of the target color. The location A, the location B, the location C, and the location D are midpoints of boundaries of the ambient light detection area, and the location E is a central location of the ambient light detection area.

In another possible implementation, the terminal device collects a color value of any location in the ambient light detection area at the start time of the ambient light collection time window, and determines the collected color value as the color value of the target color.

For example, the terminal device reads the RGB value (220, 220, 220) of the color of the location A, and determines the RGB value (220, 220, 220) as the color value of the target color.

S601: The terminal device displays the target color in the ambient light detection area in the ambient light collection time window.

The target color represents a feature of a color in the ambient light detection area before the terminal device starts to perform ambient light collection. Usually, a difference between continuous image frames is small, duration of the ambient light collection time window is limited, and content displayed by the display of the terminal device in the ambient light collection time window does not abruptly change. Therefore, displaying the ambient light detection area as the target color in the ambient light collection time window by the terminal device does not cause the detection area to be not fused with a surrounding area of the detection area.

Figure 9:
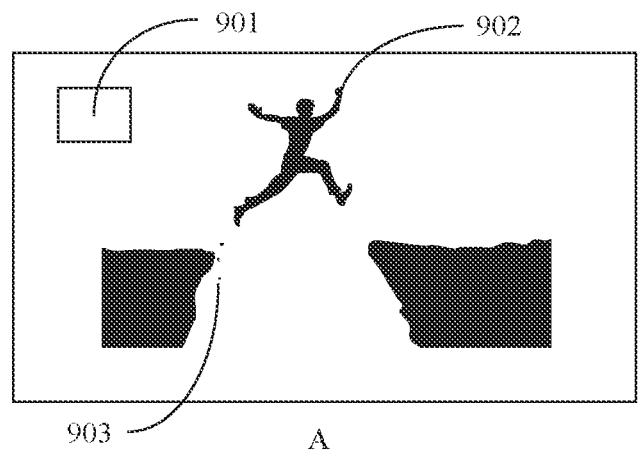
FIG. 9 is a schematic diagram of continuous image frames applicable to an embodiment of this application.
Figure 9:
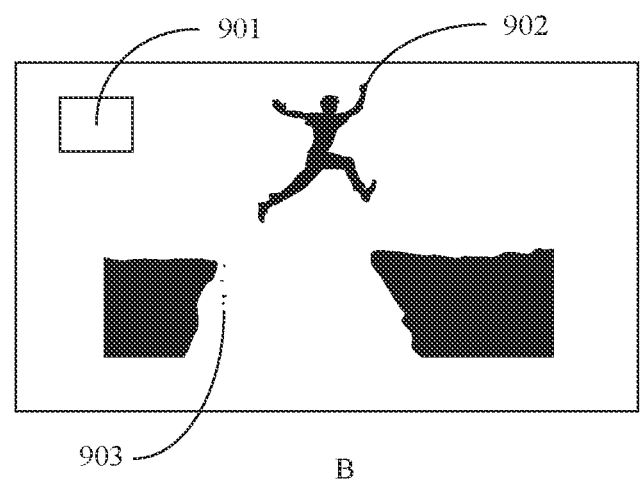
Figure 9:
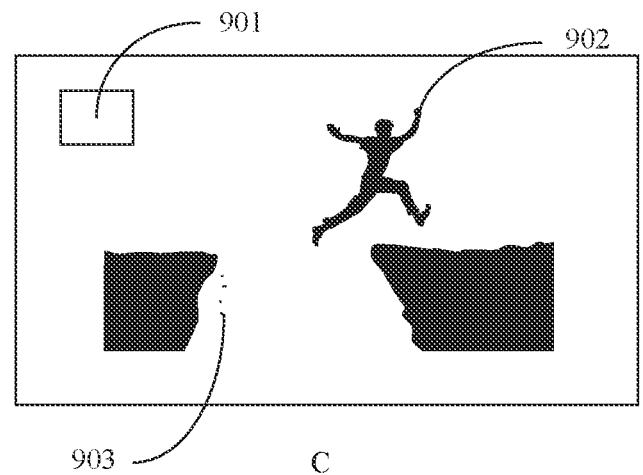

For example, a user is watching a video. A frame rate of the video is 60 frames/second, and the ambient light collection time window is 50 ms. Within a period from start to end of the ambient light collection time window, the display of the terminal device displays three frames of images such as A, B, and C shown in FIG. 9. Differences among the three frames of images lie in only locations of a character 902 and gravels 903 in the images. The content of the ambient light detection area 901 has no difference in the three frames of images. In a process of displaying the three frames of images, the terminal device displays the ambient light detection area as the target color without being perceived by the user.

In a possible implementation, the display engine in the terminal device transmits the color value of the target color and the location of the ambient light detection area to a drawing interface in the ambient light collection time window. The drawing interface invokes a two-dimensional graphics engine or a three-dimensional graphics processing library in a system library to draw the ambient light detection area, and renders the ambient light detection area as the target color. The display of the terminal device displays, to the user, the ambient light detection area that is rendered as the target color. The drawing interface is configured to perform graphics drawing. For example, the drawing interface may be drawRect( ), drawRoundRect( ), or the like.

Based on the example in S600, the terminal device displays, in the ambient light collection time window, the color in the ambient light detection area as a color whose RGB value is (176, 170, 174).

It may be understood that, in an ambient light detection process, the terminal device renders the ambient light detection area as the target color in a manner of this step. After one ambient light collection time window ends, the coprocessor sends a second indication message to the target application, where the second indication message is used to indicate that the ambient light collection time window ends. After receiving the second indication message, the target application indicates the display engine to stop triggering rendering of the color in the ambient light detection area as the target color.

S602: The terminal device determines an impact value of both a preset screen brightness value in the ambient light collection time window and the color value of the target color on an ambient illumination intensity.

In a possible implementation, the terminal device reads the impact value corresponding to both the preset screen brightness value and the color value of the target color from a plurality of stored first correspondences. The first correspondence is a correspondence among a brightness value, a color value, and an impact value. Because the color in the ambient light detection area is the target color, the first correspondence can be obtained through experimental detection, and stored in the terminal device.

For example, the first correspondences stored in the terminal device are shown in the following Table 1.

TABLE 1

| Brightness value | Color value | Impact Value |
|---|---|---|
| 500 | (112, 128, 144) | 22.3 lux |
| 50 | (176, 170, 174) | 9.4 lux |

In Table 1, an impact value corresponding to both a brightness value 500 and a color value (112, 128, 144) is 22.3, and an impact value corresponding to both a brightness value 50 and a color value (176, 170, 174) is 9.4 lux. Based on the example in which the RGB value of the target color is (176, 170, 174) in S601, the impact value determined by the terminal device is 9.4 lux.

In another possible implementation, the terminal device converts the color value of the target color into a first brightness value, where the first brightness value is a brightness value corresponding to the color value of the target color; the terminal device reads the preset screen brightness value of the display in the ambient light collection time window; and the terminal device performs weighted summation on the first brightness value and the preset screen brightness value based on preset weights to obtain a second brightness value. For example, the second brightness value=0.8*the first brightness value+0.9*the preset screen brightness value.

The terminal device reads an ambient illumination intensity corresponding to the second brightness value from preset second correspondences. The second correspondence is a correspondence between an ambient illumination intensity and a brightness value. The terminal device obtains a sampling frequency of the ambient illumination intensity in the ambient light collection time window, and determines a product of the ambient illumination intensity corresponding to the second brightness value and the sampling frequency as the impact value.

In an example, a color mode of the terminal device is an RGB mode, and the terminal device inputs a color value (176, 170, 174) of the RGB mode into a preset conversion function between the RGB mode and an HSB mode, to obtain a color value that is of the HSB mode and that corresponds to the color value of the RGB mode. A value 69 of B in the color value of the HSB mode is the first brightness value. The preset screen brightness value read by the terminal device is 60 nits. The second brightness value=0.8*69+0.9*60=109.2. The terminal device reads the ambient illumination intensity 279 corresponding to the second brightness value 109.2 from preset correspondences between ambient illumination intensities and brightness values. The sampling frequency for obtaining the ambient illumination intensity by the terminal device is 3. The terminal device uses the product of the ambient illumination intensity 279 and the sampling frequency 3 as the impact value.

S603: The terminal device corrects the detected ambient illumination intensity based on the impact value to obtain a corrected ambient illumination intensity.

In a possible implementation, the terminal device performs a preset operation on the detected ambient illumination intensity and the impact value to obtain the corrected ambient illumination intensity. When the impact value is an illumination intensity greater than an actual ambient illumination intensity, the preset operation may be a subtraction operation, or when the impact value is an impact percentage for the actual ambient illumination intensity, the corrected ambient illumination intensity meets a formula as follows: the corrected ambient illumination intensity=the detected ambient illumination intensity/(1+the impact value).

In an example, if the ambient illumination intensity detected by the terminal device is 1000 lux and the impact value is 100 lux, the preset operation is that the impact value is subtracted from the detected ambient illumination intensity. In this case, the corrected ambient illumination intensity obtained by the terminal device is 1000−100=900 lux.

In another example, the impact value is 20%, and the detected ambient illumination intensity is 1000 lux, where 20% is used to represent that the detected ambient illumination intensity is increased by 20% due to the color in the ambient light detection area and the preset screen brightness value. In this case, the preset operation is that the detected ambient illumination intensity is divided by a sum of the impact value and 1, and the corrected ambient illumination intensity obtained by the terminal device is 1000/1.2=833.33.

Optionally, S604: The terminal device reads a third brightness value corresponding to the corrected ambient illumination intensity from a plurality of preset third correspondences. The third correspondence is a correspondence between an illumination intensity and a screen brightness value.

For example, the third correspondences stored in the terminal device are shown in the following Table 2.

TABLE 2

| Ambient illumination intensity | Screen brightness value |
|---|---|
| 900 lux | 320 nits |
| 833.33 lux | 296 nits |

In Table 2, when an ambient illumination intensity is 900 lux, a corresponding screen brightness value is 320 nits; and when an ambient illumination intensity is 833.33 lux, a corresponding screen brightness value is 296 nits. Based on the foregoing example in which the corrected ambient illumination intensity is 900 lux, the screen brightness value corresponding to 900 lux is 320 nits.

Optionally, S605: The terminal device adjusts the brightness value of the display from a current brightness value to the third brightness value.

In a possible implementation, when a difference between the current brightness value and the third brightness value is greater than a preset threshold, the terminal device adjusts the brightness value of the display from the current brightness value to the third brightness value in a gradient change manner.

Based on the foregoing example, if the current brightness value is 60 nits and the third brightness value is 90 nits, the terminal device may increase 10 nits every 10 m within second preset duration of 30 ms, to change a screen brightness value of the terminal device from 60 nits to 90 nits.

It may be understood that the first correspondence to the third correspondence each may exist in a function form, for example, the first correspondence meets $z=f(x, y)$. $z$ is the impact value, and $f(\ )$ is a function used to represent the first correspondence. $x$ is the preset screen brightness value, and $y$ is the color value of the target color.

In this embodiment of this application, the terminal device displays the color in the ambient light detection area in the display as the target color in the ambient light collection time window, and calculates the impact value of both the color value of the target color and the preset screen brightness value in the ambient light collection time window on the ambient illumination intensity, and the terminal device corrects the detected ambient illumination intensity based on the impact value. In this way, in a process in which the terminal device collects the ambient illumination intensity, the color value in impact factors of a collection result is single. Therefore, an impact value calculation method is simple with high calculation accuracy, and the ambient illumination intensity corrected based on the calculated impact value is more accurate.

Figure 10:
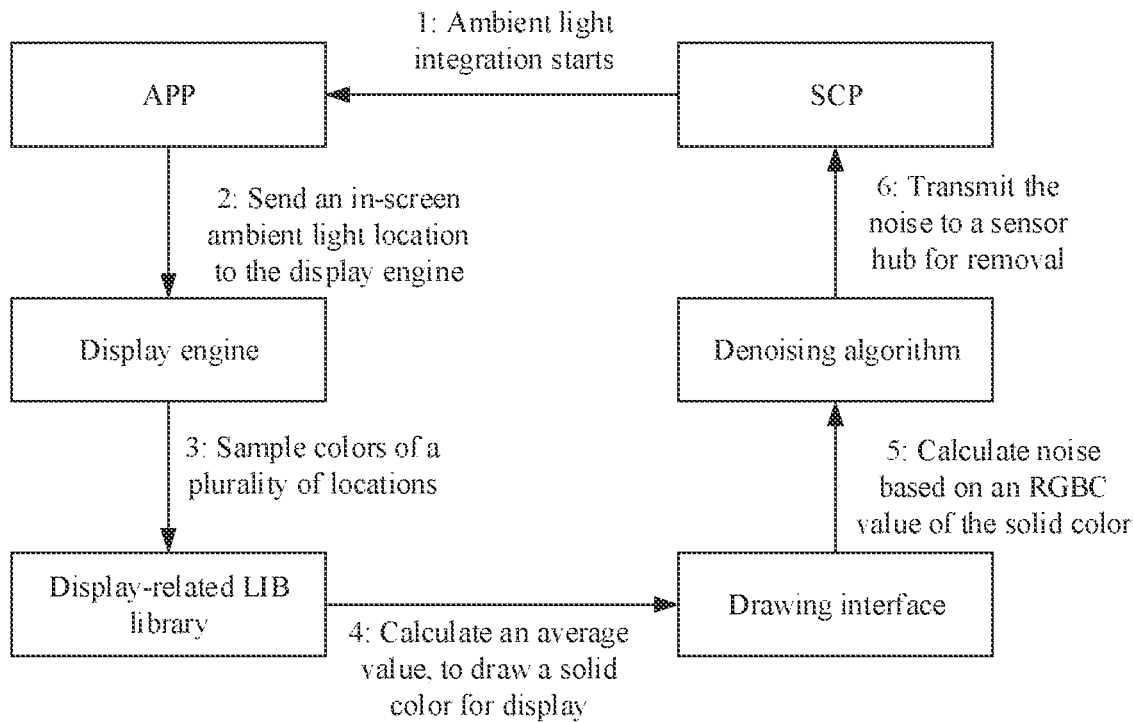
FIG. 10 is a schematic flowchart of an ambient illumination intensity determining method according to an embodiment of this application.

FIG. 10 is a schematic flowchart of an ambient illumination intensity determining method according to an embodiment of this application. FIG. 10 includes the following steps.

Step 1: An SCP in a terminal device sends a first indication message to an application before an ambient light collection time window starts, where the first indication message is used to indicate that ambient light integration starts. The application is an application provided in this embodiment of this application, and the application runs at the application layer shown in FIG. 6.

It should be noted that start of the ambient light integration is used to represent that an ambient light sensor is about to start to detect an ambient illumination intensity. In a process of detecting the ambient illumination intensity based on ambient light, a photodiode in the ambient light sensor converts a received optical signal into a current. An ADC in the ambient light sensor integrates the current from the photodiode, and power may be obtained by integrating the current. The ADC converts, into light sensing data represented by a digital signal, the power obtained by integrating the current. The ambient light sensor obtains the ambient illumination intensity based on the light sensing data.

Step 2: In response to the received first indication message, the application sends an in-screen ambient light location to a display engine.

The in-screen ambient light location corresponds to the location of the ambient light detection area in the display in the foregoing embodiment. For example, as shown in FIG. 2, a location of each vertex of the ambient light detection area 211 in the display 21 in FIG. 2 may be the location of the ambient light detection area 211 in the display 21.

In a possible implementation, the application sends, in a parameter transmission manner, the location of the ambient light detection area in the display to the display engine at the application framework layer in the block diagram of the software structure shown in FIG. 6.

Step 3: The display engine samples colors of a plurality of locations.

In a possible implementation, the display engine at the application framework layer may invoke code in a preset codebase (for example, a display-related LIB library) based on current display content of the display of the terminal device and the location of the ambient light detection area in the display, to sample color values of the plurality of locations in the ambient light detection area. The plurality of locations may be a preset quantity of locations randomly obtained by the display engine from the ambient light detection area, or may be a plurality of locations evenly obtained by the display engine from the ambient light detection area based on a preset distance.

For example, the color values of the location A to the location E in the ambient light detection area shown in FIG. 8 are sampled by the display engine.

Step 4: The display engine calculates an average value, to draw a solid color for display.

In a possible implementation, the display engine invokes the code in the preset codebase (for example, the display-related LIB library), to calculate the average value of the sampled color values of the plurality of locations. The average value is the color value of the target color in S600. For a calculation manner of the average value, refer to the foregoing manner of obtaining the color value of the target color. Details are not described again.

The display engine transmits the color value of the target color and the location of the ambient light detection area to a drawing interface in the ambient light collection time window. The drawing interface invokes a two-dimensional graphics engine or a three-dimensional graphics processing library in a system library to draw the ambient light detection area, and renders the ambient light detection area as the target color.

Step 5: The display engine calculates noise based on an RGBC value of the solid color.

The RGBC value of the solid color includes an RGB value of the solid color and a current preset screen brightness (clear, C) value. The noise is the impact value in S602 in the foregoing embodiment.

For a possible implementation and an example, refer to the description in S602. Details are not described again.

Step 6: The display engine transmits the noise to a sensor hub for removal.

For a manner in which the sensor hub removes the noise, refer to the description in which the terminal device corrects the detected ambient illumination intensity based on the impact value to obtain the corrected ambient illumination intensity in S603 in the foregoing embodiment. Details are not described again.

In this embodiment of this application, in a process in which the ambient light sensor detects the ambient illumination intensity, the terminal device displays the color in the ambient light detection area in the display as the solid color, and calculates the noise of both a color value of the solid color and a preset screen brightness value in the ambient light collection time window to the ambient illumination intensity, and the sensor hub in the terminal device removes the noise in the detected ambient illumination intensity. In this way, in a process in which the terminal device collects the ambient illumination intensity, the color value in impact factors of a collection result is single. Therefore, an impact value calculation method is simple with high calculation accuracy, and the detected ambient illumination intensity tends to be closer to a real ambient illumination intensity after the noise is removed.

The foregoing mainly describes the solutions provided in the embodiments of this application from a method perspective. To implement the foregoing functions, the terminal device includes corresponding hardware structures and/or software modules for performing the functions. A person skilled in the art should be easily aware that the method steps in the examples described with reference to the embodiments disclosed in this specification can be implemented in this application in a form of hardware or a combination of hardware and computer software. Whether a specific function is performed by hardware or hardware driven by computer software depends on a particular application and a design constraint of the technical solutions. A skilled person may use different methods to implement the described functions for each specific application, but it should not be considered that the implementation goes beyond the scope of this application.

In the embodiments of this application, an apparatus for implementing an ambient illumination intensity determining method may be divided into functional modules based on the foregoing method examples, for example, each functional module may be obtained through division for each corresponding function, or two or more functions may be integrated into one processing module. For example, functions of the target application, the drawing interface, and the display engine are integrated into a display control unit. The integrated module may be implemented in a form of hardware, or may be implemented in a form of a software functional module. It should be noted that division of the modules in the embodiments of this application is an example, and is merely logical function division. During actual implementation, there may be another division manner.

Figure 11:
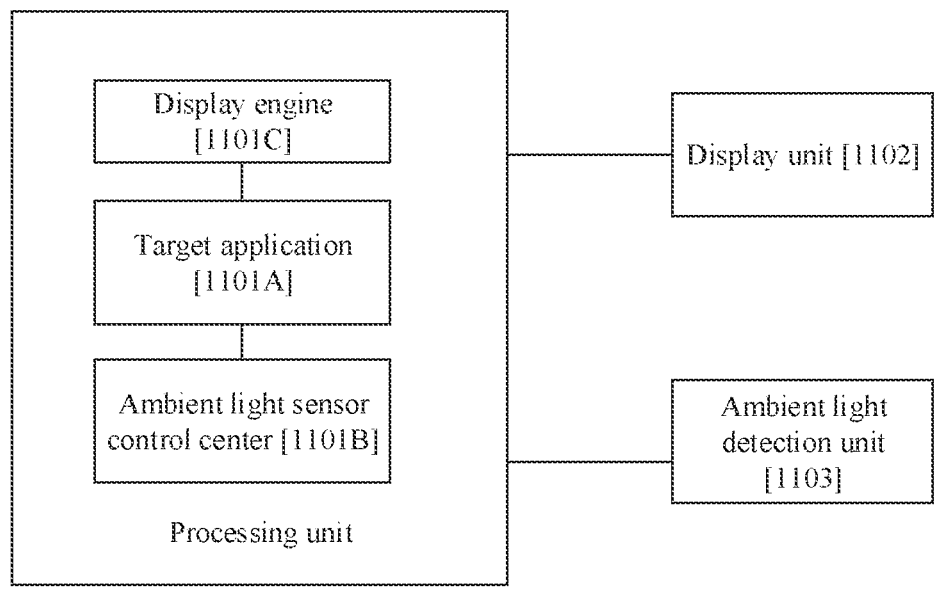
FIG. 11 is a schematic diagram of a structure of an ambient illumination intensity determining apparatus according to an embodiment of this application.

FIG. 11 is a schematic diagram of a structure of an ambient illumination intensity determining apparatus according to an embodiment of this application. The ambient illumination intensity determining apparatus shown in FIG. 11 includes a processing unit 1101, a display unit 1102, and an ambient light detection unit 1103. An ambient light detection area is disposed in the display unit 1102, and the ambient light detection unit 1103 is disposed in a coverage area of the ambient light detection area. When the display unit 1102 is turned on and an integration period of the ambient light detection unit 1103 starts, the processing unit 1101 is configured to determine a color value of a target color in the ambient light detection area, where the target color is used to represent a feature of a color in the ambient light detection area. Within the integration period, the processing unit 1101 is configured to: control the ambient light detection area to display the target color, and detect a first ambient illumination intensity by using the ambient light detection unit 1103; determine a target impact value of both a brightness value of the display unit 1102 and the color value of the target color on the first ambient illumination intensity; and correct the first ambient illumination intensity based on the target impact value to obtain a second ambient illumination intensity. For example, with reference to FIG. 7, the processing unit may be configured to perform S600~S605.

Optionally, the processing unit 1101 is specifically configured to: convert the color value of the target color to obtain a first brightness value corresponding to the color value of the target color; perform weighted summation on the first brightness value and the brightness value of the display unit 1102 based on preset weights to obtain a second brightness value; obtain an ambient illumination intensity corresponding to the second brightness value from a plurality of preset first correspondences, where the first correspondence is a correspondence between a brightness value and an ambient illumination intensity; obtain a quantity of frames of images displayed by the display unit 1102 within the integration period to obtain a sampling frequency; and determine a product of the ambient illumination intensity corresponding to the second brightness value and the sampling frequency as the target impact value.

Optionally, the sampling frequency meets a formula as follows: the sampling frequency=the integration period*a screen refresh rate/1000. The screen refresh rate is a preset quantity of frames of images displayed by the display unit 1102 per second.

Optionally, the processing unit 1101 is specifically configured to obtain the target impact value corresponding to both the brightness value of the display unit 1102 and the color value of the target color from a plurality of preset second correspondences (corresponding to the first correspondences in this embodiment), where the second correspondence is a correspondence among a brightness value, a color value, and an impact value. In this way, because the color in the ambient light detection area is the target color, the second correspondence can be obtained through experimental detection, and stored in the terminal device.

Optionally, the processing unit 1101 is specifically configured to: collect color values of a plurality of locations in the ambient light detection area; and calculate an average value of the color values of the plurality of locations to obtain the color value of the target color.

Optionally, the processing unit 1101 is specifically configured to collect a color value of any location in the ambient light detection area to obtain the color value of the target color.

Optionally, the target impact value, the first ambient illumination intensity, and the second ambient illumination intensity meet a formula as follows: the second ambient illumination intensity+the target impact value=the first ambient illumination intensity; or the second ambient illumination intensity+the second ambient illumination intensity*the target impact value=the first ambient illumination intensity.

Optionally, the processing unit 1101 is further configured to: obtain a target screen brightness value corresponding to the second ambient illumination intensity from a plurality of preset third correspondences, where the third correspondence is a correspondence between an ambient illumination intensity and a screen brightness value; and adjust the brightness value of the display unit 1102 to the target screen brightness value.

Optionally, the processing unit 1101 includes an ambient light sensor control center 1101A and a target application 1101B. The ambient light sensor control center 1101A is configured to transmit a first indication message to the target application 1101B based on the preset integration period when the integration period starts, where the first indication message is used to indicate that the integration period starts.

Optionally, the processing unit 1101 further includes a display engine 1101C. The target application 1101B is configured to transmit, in response to the first indication message, a location of the ambient light detection area in the display unit 1102 to the display engine 1101C; and the display engine 1101C is configured to determine the color value of the target color in the ambient light detection area based on display content of a display and the location of the ambient light detection area in the display.

Optionally, the display engine 1101C is configured to transmit the target impact value to the ambient light sensor control center 1101A; and the ambient light sensor control center 1101A is configured to correct the first ambient illumination intensity based on the target impact value to obtain the second ambient illumination intensity.

Optionally, the ambient light sensor control center 1101A is further configured to transmit a second indication message to the target application 1101B, where the second indication message is used to indicate that the integration period ends; and the target application 1101B is configured to control the display engine 1101C to stop triggering display of the ambient light detection area as the target color.

In an example, with reference to FIG. 5, a function of the processing unit 1101 may be implemented by the processor 301 in FIG. 5 by invoking a computer program in the internal memory 302. A function of the display unit 1102 may be implemented by the display 304 in FIG. 5, and a function of the ambient light detection unit 1103 may be implemented by the ambient light sensor 303 in FIG. 5.

Figure 12:
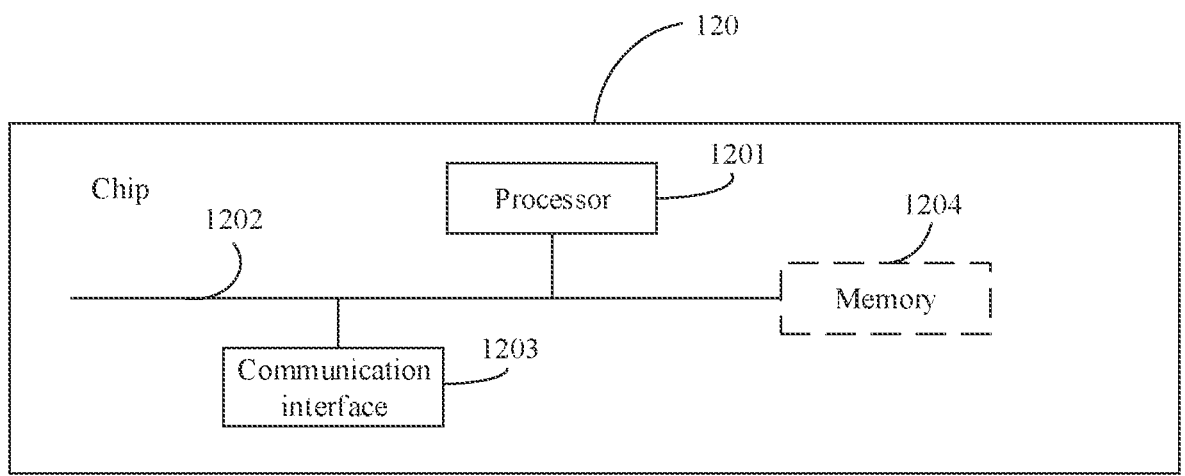
FIG. 12 is a schematic diagram of a structure of a chip according to an embodiment of this application.

FIG. 12 is a schematic diagram of a structure of a chip according to an embodiment of this application. The chip 120 includes one or more (including two) processors 1201, a communication line 1202, and a communication interface 1203.

In some implementations, a memory 1204 stores the following elements: an executable module or a data structure, or a subset thereof, or an extended set thereof.

The foregoing method described in the embodiments of this application may be applied to the processor 1201, or implemented by the processor 1201. The processor 1201 may be an integrated circuit chip with a signal processing capability. In an implementation process, the steps of the foregoing method may be completed by using a hardware-integrated logic circuit in the processor 1201 or instructions in a form of software. The processor 1201 may be a general-purpose processor (for example, a microprocessor or a conventional processor), a digital signal processor (DSP), an application specific integrated circuit (ASIC), a field-programmable gate array (FPGA) or another programmable logic device, a discrete gate, or a transistor logic device or a discrete hardware component. The processor 1201 may implement or perform the methods, steps, and logic block diagrams disclosed in the embodiments of this application.

The steps of the method disclosed in the embodiments of this application may be directly performed by a hardware decoding processor or performed by a combination of hardware and a software module in a decoding processor. The software module may be located in a mature storage medium in the art, for example, a random access memory, a read-only memory, a programmable read-only memory, or an electrically erasable programmable read only memory (EEPROM). The storage medium is located in the memory 1204, and the processor 1201 reads information in the memory 1204 and completes the steps of the foregoing method in combination with hardware in the processor 1201.

The processor 1201, the memory 1204, and the communication interface 1203 may communicate with each other by using the communication line 1202.

In the foregoing embodiments, the instructions stored in the memory for execution by the processor may be implemented in a form of a computer program product. The computer program product may be written in the memory in advance, or may be downloaded and installed in the memory in a form of software.

An embodiment of this application further provides a computer program product, including one or more computer instructions. When the computer program instructions are loaded and executed on a computer, the procedures or functions in the embodiments of this application are completely or partially generated. The computer may be a general-purpose computer, a dedicated computer, a computer network, or another programmable apparatus. The computer instructions may be stored in a computer-readable storage medium or transmitted from one computer-readable storage medium to another computer-readable storage medium. For example, the computer instructions may be transmitted from one website, computer, server, or data center to another website, computer, server, or data center in a wired (for example, a coaxial cable, an optical fiber, or a digital subscriber line (DSL)) manner or a wireless (for example, infrared, radio, or microwave) manner. The computer-readable storage medium may be any available medium that can be stored in the computer, or a data storage device integrating one or more available media, for example, a server or a data center. For example, the available medium may include a magnetic medium (for example, a floppy disk, a hard disk, or a magnetic tape), an optical medium (for example, a digital versatile disc (DVD)), a semiconductor medium (for example, a solid state disk (SSD)), or the like.

An embodiment of this application provides an electronic device. The electronic device may perform the method performed by the terminal device in any ambient illumination intensity determining method described above.

An embodiment of this application further provides a computer-readable storage medium. The method described in the foregoing embodiments may be completely or partially implemented by using software, hardware, firmware, or any combination thereof. The computer-readable medium may include a computer storage medium and a communication medium, and may further include any medium that enables a computer program to be transmitted from one place to another place. The storage medium may be any target medium accessible by a computer.

In a possible design, the computer-readable medium may include a compact disc read-only memory (CD-ROM), a RAM, a ROM, an EEPROM, or another optical disc memory; or the computer-readable medium may include a magnetic disk memory or another magnetic disk storage device. In addition, any connecting line may also be appropriately referred to as a computer-readable medium. For example, if software is transmitted from a website, a server, or another remote source by using a coaxial cable, an optical fiber cable, a twisted pair, a DSL, or wireless technologies (for example, infrared, radio, and microwave), the coaxial cable, the optical fiber cable, the twisted pair, the DSL, or the wireless technologies such as infrared, radio, and microwave are included in the definition of the medium. As used herein, a magnetic disk and an optical disk include a compact disc (CD), a laser disc, an optical disc, a digital versatile disc (DVD), a floppy disk, and a Blu-ray disc. The magnetic disk usually reproduces data in a magnetic manner, and the optical disk reproduces data optically by using laser.

The foregoing combinations should also be included in the scope of the computer-readable medium. The foregoing descriptions are merely specific implementations of this application, and are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method, comprising:
   determining a color value of a target color in an ambient light detection area when a display is turned on and an integration period of an ambient light sensor starts, wherein the ambient light detection area is disposed in the display and the ambient light sensor is disposed in a coverage area of the ambient light detection area, and wherein the target color is used to represent a feature of a color in the ambient light detection area;
   controlling the ambient light detection area to display the target color within the integration period;
   detecting a first ambient illumination intensity with the ambient light sensor;
   determining a target impact value of both a brightness value of the display and the color value of the target color on the first ambient illumination intensity; and
   correcting the first ambient illumination intensity based on the target impact value to obtain a second ambient illumination intensity.

2. The method of claim 1, wherein the determining the target impact value of both the brightness value of the display and the color value of the target color on the first ambient illumination intensity comprises:
converting the color value of the target color to obtain a first brightness value corresponding to the color value of the target color;
performing a weighted summation on the first brightness value and the brightness value of the display based on preset weights to obtain a second brightness value;
obtaining an ambient illumination intensity corresponding to the second brightness value from a plurality of preset first correspondences, wherein the preset first correspondence is a correspondence between the brightness value of the display and the ambient illumination intensity; and
obtaining a quantity of frames of images displayed by the display within the integration period to obtain a sampling frequency, wherein the target impact value is a product of the ambient illumination intensity corresponding to the second brightness value and the sampling frequency.

3. The method of claim 2, wherein the sampling frequency is equal to the integration period*a screen refresh rate/1000, wherein the screen refresh rate is a preset quantity of frames of images displayed by the display per second.

4. The method of claim 1, wherein the determining the target impact value of both the brightness value of the display and the color value of the target color on the first ambient illumination intensity comprises obtaining the target impact value corresponding to both the brightness value of the display and the color value of the target color from a plurality of preset second correspondences, wherein the preset second correspondence is a correspondence among the brightness value of the display, the color value, and the impact value.

5. The method of claim 1, wherein the color value of the target color in the ambient light detection area is an average value of color values of a plurality of locations in the ambient light detection area.

6. The method of claim 1, wherein the color value of the target color in the ambient light detection area is a color value of any location in the ambient light detection area.

7. The method of claim 1, wherein the first ambient illumination intensity is equal to either a) the second ambient illumination intensity+the target impact value, or b) the second ambient illumination intensity+the second ambient illumination intensity*the target impact value.

8. The method of claim 1, further comprising:
obtaining a target screen brightness value corresponding to the second ambient illumination intensity from a plurality of preset third correspondences, wherein the preset third correspondence is a correspondence between an ambient illumination intensity and a screen brightness value; and
adjusting the brightness value of the display to the target screen brightness value.

9. The method of claim 1, further comprising transmitting, by an ambient light sensor control center, a first indication message to a target application based on a preset integration period when the integration period starts, wherein the first indication message indicates that the integration period starts.

10. The method of claim 9, wherein the determining the color value of the target color in the ambient light detection area comprises:

transmitting, by the target application in response to the first indication message, a location of the ambient light detection area in the display to a display engine; and
determining, by the display engine, the color value of the target color in the ambient light detection area based on display content of the display and the location of the ambient light detection area in the display.

11. The method of claim 10, further comprising transmitting, by the display engine, the target impact value to the ambient light sensor control center, wherein the ambient light sensor control center corrects the first ambient illumination intensity based on the target impact value to obtain the second ambient illumination intensity.

12. The method of claim 11, further comprising:
transmitting, by the ambient light sensor control center, a second indication message to the target application, wherein the second indication message indicates that the integration period ends; and
controlling, by the target application, the display engine to stop triggering display of the ambient light detection area as the target color.

13. The method of claim 10, further comprising:
transmitting, by the ambient light sensor control center, a second indication message to the target application, wherein the second indication message is used to indicates that the integration period ends; and
controlling, by the target application, the display engine to stop triggering display of the ambient light detection area as the target color.

14. The method of claim 1, wherein determining the color value of the target color in the ambient light detection area comprises:
transmitting, by a target application in response to a first indication message indicating that the integration period starts, a location of the ambient light detection area in the display to a display engine; and
determining, by the display engine, the color value of the target color in the ambient light detection area based on display content of the display and the location of the ambient light detection area in the display.

15. The method of claim 1, further comprising transmitting, by a display engine, the target impact value to an ambient light sensor control center, wherein the ambient light sensor control sensor corrects the first ambient illumination intensity based on the target impact value to obtain the second ambient illumination intensity.

16. The method of claim 1, further comprising:
transmitting, by an ambient light sensor control center, a second indication message to a target application, wherein the second indication message indicates that the integration period ends; and
controlling, by the target application, a display engine to stop triggering display of the ambient light detection area as the target color.

17. An electronic device, comprising:
a display having an ambient light detection area disposed therein;
an ambient light sensor disposed in a coverage area of the ambient light detection area;
one or more processors coupled to the display and the ambient light sensor; and
a memory coupled to the one or more processors, wherein the memory is configured to store instructions that, when executed by the one or more processors, cause the electronic device to be configured to:
determine a color value of a target color in the ambient light detection area when the display is turned on and an integration period of the ambient light sensor starts, wherein the target color is used to represent a feature of a color in the ambient light detection area;

control the ambient light detection area to display the target color within the integration period;

detect a first ambient illumination intensity with the ambient light sensor;

determine a target impact value of both a brightness value of the display and the color value of the target color on the first ambient illumination intensity; and correct the first ambient illumination intensity based on the target impact value to obtain a second ambient illumination intensity.

18. The electronic device of claim 17, wherein the color value of the target color in the ambient light detection area is an average value of color values of a plurality of locations in the ambient light detection area.

19. The electronic device of claim 17, wherein the determining the target impact value of both the brightness value of the display and the color value of the target color on the first ambient illumination intensity comprises obtaining the target impact value corresponding to both the brightness value of the display and the color value of the target color from a plurality of preset second correspondences, wherein the preset second correspondence is a correspondence among the brightness value of the display, the color value, and the impact value.

20. A non-transitory computer-readable storage medium storing instructions that, when executed by one or more processors of an electronic device, cause the electronic device to be configured to:

determine a color value of a target color in an ambient light detection area when a display is turned on and an integration period of an ambient light sensor starts, wherein the ambient light detection area is disposed in the display and the ambient light sensor is disposed in a coverage area of the ambient light detection area, wherein the target color is used to represent a feature of a color in the ambient light detection area;

control the ambient light detection area to display the target color within the integration period;

detect a first ambient illumination intensity with the ambient light sensor;

determine a target impact value of both a brightness value of the display and the color value of the target color on the first ambient illumination intensity; and correct the first ambient illumination intensity based on the target impact value to obtain a second ambient illumination intensity.

\* \* \* \* \*

UNITED STATES PATENT AND TRADEMARK OFFICE
CERTIFICATE OF CORRECTION

PATENT NO. : 12,067,923 B2
APPLICATION NO. : 18/548132
DATED : August 20, 2024
INVENTOR(S) : Zhengqi Zhang It is certified that error appears in the above-identified patent and that said Letters Patent is hereby corrected as shown below:

In the Claims

Claim 13, Column 26, Lines 25-26: "message is used to indicates that" should read "message indicates that"

Signed and Sealed this
Twenty-fourth Day of September, 2024

*Katherine Kelly Vidal*

Katherine Kelly Vidal
*Director of the United States Patent and Trademark Office*